United States Patent
Hovsepian et al.

(10) Patent No.: US 8,173,248 B2
(45) Date of Patent: May 8, 2012

(54) PVD COATED SUBSTRATE

(75) Inventors: Papken Hovsepian, Sheffield (GB);
Arutiun P. Ehiasarian, Sheffield (GB)

(73) Assignee: Sheffield Hallam University (GB)

( * ) Notice: Subject to any disclaimer, the term of this patent is extended or adjusted under 35 U.S.C. 154(b) by 870 days.

(21) Appl. No.: 11/912,549

(22) PCT Filed: Apr. 25, 2006

(86) PCT No.: PCT/GB2006/001509
§ 371 (c)(1),
(2), (4) Date: Jun. 30, 2008

(87) PCT Pub. No.: WO2006/114610
PCT Pub. Date: Nov. 2, 2006

(65) Prior Publication Data
US 2008/0260478 A1   Oct. 23, 2008

(30) Foreign Application Priority Data
Apr. 27, 2005 (GB) .................... 0508485.0

(51) Int. Cl.
*B32B 9/00* (2006.01)
*C23C 28/02* (2006.01)

(52) U.S. Cl. ....... 428/216; 51/307; 51/309; 204/192.11; 204/192.15; 204/192.16; 204/192.32; 204/192.34; 204/192.38; 428/336; 428/697; 428/698; 428/699

(58) Field of Classification Search ........... 51/307, 51/309; 428/216, 336, 697, 698, 699; 204/192.11, 204/192.15, 192.16, 192.32, 192.34, 192.38
See application file for complete search history.

(56) References Cited

U.S. PATENT DOCUMENTS

| 4,842,710 | A | * | 6/1989 | Freller et al. | 204/192.16 |
| 5,208,102 | A | * | 5/1993 | Schulz et al. | 428/336 |
| 5,981,049 | A | * | 11/1999 | Ohara et al. | 204/192.15 |
| 6,103,357 | A |   | 8/2000 | Selinder et al. | |
| 6,296,928 | B1 | * | 10/2001 | Yamada et al. | 428/216 |
| 6,767,658 | B2 | * | 7/2004 | Yamamoto et al. | 428/698 |
| 7,300,559 | B2 | * | 11/2007 | Gorokhovsky | 204/192.38 |
| 2003/0148145 | A1 |   | 8/2003 | Yamamoto et al. | |
| 2004/0076856 | A1 |   | 4/2004 | Hugosson | |

FOREIGN PATENT DOCUMENTS

| EP | 0846784 A2 | | 6/1998 |
| EP | 0870565 A2 | | 10/1998 |
| EP | 00/08234 | * | 2/2000 |
| EP | 0999290 A1 | | 5/2000 |
| JP | 02-138458 | | 5/1990 |
| JP | 04-221057 | | 8/1992 |

* cited by examiner

*Primary Examiner* — A. A. Turner
(74) *Attorney, Agent, or Firm* — Clark Hill PLC

(57) ABSTRACT

A PVD coating is disclosed, and in particular a nanoscale multilayer superlattice PVD coating comprising high hardness, a low friction coefficient and increased chemical inertness. The multilayer coating comprises a repeating bilayer represented by $(V_xMe_{(i-x)})C_yN_{(i-y)}/(Me_zV_{(1-z)})C_yN_{(i-y)}$ where $0.1 \leq x \leq 0.9$; $0.01 < y < 0.99$ and $0.1 \leq z \leq 0.9$ and Me is a substantially pure metal or a metal alloy. The composition of the coating through the layers alternates from layer to layer according to a V-rich layer and a Me-rich layer modulated sequence. Vanadium is incorporated within the layer composition and has been found to act as a lubricating agent during sliding wear. Carbon, also incorporated within the coating, serves to further stabilize the friction coefficient thereby increasing the chemical inertness between cutting tool and workpiece material.

42 Claims, 5 Drawing Sheets

PVD COATED SUBSTRATE

RELATED/PRIORITY APPLICATION

This application is a National Phase filing regarding International Application No. PCT/GB2006/001509, filed on Apr. 25, 2006. International Application No. PCT/GB2006/001509 claims priority from British Application No. 0508485.0, filed on Apr. 27, 2005.

FIELD OF THE INVENTION

The present invention relates to a coating for a substrate and, in particular although not exclusively, to a coating for a cutting tool exhibiting high hardness, low friction and increased chemical inertness.

BACKGROUND TO THE INVENTION

There is a continued increase in the requirement for highly durable cutting tools in response to the demand for and manufacture of more exotic, sophisticated high strength, structural materials used particularly within the aerospace and automotive industries. These materials bring substantial benefits to these industries due to their very high strength to low weight ratio.

For example, highly used carbon-based composite, workpiece materials laminated with aluminum alloy sheeting, are so abrasive that unprotected, standard cutting tools are capable of cutting a relatively small portion only of the workpiece material. Being dependent upon the composition of the laminates, the cutting process has to cope with different cutting actions in the aluminium and the hard and abrasive synthetic component. This is further complicated by the orientation of the top and bottom layers when "through" drilling the composite materials. A composite with an aluminium top and bottom layer is easier to machine than a material with a synthetic top and bottom layer due to the tearing of the fibre strands on entry and especially at break through. The cutting edges of such tools are blunted very rapidly after, for example only two drilling operations, whereby the tool is no longer suitable for use and must be discarded.

An additional class of materials that is very difficult to machine are commonly known as 'sticky alloys' such as nickel and aluminum based alloys. When a cutting tool is employed to mechanically cut such materials, a significant temperature rise is observed in the region of contact between the cutting tool and alloy based material. This arises as a result of the mechanical energy required to overcome frictional resistance as sliding at the contact interface occurs at the micron level. This increase in temperature can be substantial and can result in localized changes in the material properties including increased chemical reactivity and in particular chemical interaction between the workpiece material and the cutting tool or any coating applied to the cutting tool.

A further class of material that presents machining problems includes stainless steel and titanium based alloys. Both these types of alloy exhibit low thermal conductivity resulting in intensive heat generation at the cutting region. In particular the temperature of a cutting edge of a tool is so high that it is common to detect micro welding or material transfer due to the intensified chemical interaction between the workpiece material and the cutting tool or coating formed on the tool. Consequently, it is a common problem for the geometry of the cutting tool to alter, following only small or moderate periods of cutting of these types of alloy, thereby deteriorating the cutting performance.

In an attempt to address the above problems, many cutting tool coatings have been developed. The main, desirable properties of such coatings include a low friction coefficient and very high wear resistance.

One such coating that attempts to address the above problems is disclosed in EP 0870565. An edge portion of the cutting tool is coated with at least one layer of a film of composition $(Ti_{(1-x)}Al_x)(N_y C_{(1-y)})$ where $0.2 \leq x \leq 0.85$ and $0.25 \leq y \leq 1.0$.

US 2003/0148145 discloses a hard film exhibiting high wear resistance, with composition of $(Al_b,[Cr_{1-\alpha}V_\alpha]_c(C_{1-d}N_d)$, satisfying the condition of $0.5 \leq b \leq 0.8$, $0.2 \leq c \leq 0.5$, $b+c=1$, $0.05 \leq \alpha \leq 0.95$, $0.5 \leq d \leq 1$ (where b and c each represent atomic ratio of Al and Cr+V, and d denotes atomic ratio of N, $\alpha$ denotes atomic ratio of V), or with composition of $(M_\alpha,Al_b,[Cr_{1-\alpha}V_\alpha]_c(C_{1-d}N_d)$, wherein M is at least one element selected from Ti, Nb, W, Ta and Mo and satisfying the condition of $0.02 \leq \alpha \leq 0.3$, $0.5 \leq b \leq 0.8$, $0.05 \leq c$, $\alpha+b+c=1$, $0.5 \leq d \leq 1$, $0 \leq \alpha \leq 1$ (where $\alpha$ represents atomic ratio M). The layered coating disclosed includes two or more layers of hard films laminated together and different from each other. Alternatively, the coating is formed as a single layer. A method of forming the wear resistance film is also described.

EP 0846784 discloses a coated tool and method of manufacturing the same. The coated tool comprises a base material and a wear resistant coating film formed on the base material. The composition of the wear resistant coating film is expressed as $(Ti_x,Al_y,V_z)(C_u,N_v,O_w)$. Relations $x+y+z=1$, $u+v+w=1$, $0.2<x \leq 1$ and $0 \leq y<0.8$, $0.02 \leq z<0.6$, $0 \leq u<0.7$, $0.3<v \leq 1$ and $0 \leq w<0.5$ hold between x, y, z, u, v and w. The thickness if the wear resistant coating film is stated as at least 0.5 µm and not more than 15 µm. The coated cutting tool comprises a case material consisting of cemented carbide and a wear resistant coating film formed on the surface of the base material. The outermost surface of the wear resistant coating film is coated with a low melting point oxide, containing vanadium oxide, having a melting point of not more than 1000° C.

EP 0999290 discloses a wear resistant hard coating and a cutting tool coated with the same. The hard coating includes an adhesion reinforcing layer formed on a surface of the tool; and a second layer on the adhesion reinforcing layer and having a composition represented by: $(Al_pTi_qV_r)(N_uC_v)$ where $0 \leq p \leq 0.75$, $0.20 \leq q \leq 0.75$, $0.10 \leq r \leq 0.75$, $p+q+r=1$, $0.6 \leq u \leq 1$, and $u+v=1$. In order to further enhance the adhesion of the hard coating to the cutting tool an intermediate layer may be formed between the first and second layers.

JP 4221057 discloses a wear resistant coating film of thickness 0.8-10 µm and having a chemical composition represented by $(V_xTi_{1-x})(N_yC_{1-y})$ where $0.25 \leq x \leq 0.75$ and $0.6 \leq y=1$ formed on the surface of a substrate using an arc discharge process.

Nanoscale multilayer superlattice PVD coatings exhibit high hardness, (HP>40 GPa), wear resistance, and excellent protection against corrosion depending upon the choice of material partners. The terms superlattice, within the context of coatings, refers to a high-hardness coating having a modulating layered structure of two or more materials with nanometer-layer thickness dimensions. Superlattice structures are qualified by the distance between each successive pair of layers which is typically know as the 'bilayer repeat period'. Various material coating combinations based on TiN and TiAlN are disclosed in *Surface and Coating Technology* 133-134 (2000) 166-175 and *Surface Engineering* 2001 vol. 17 no. 1 15-27. These papers describe the properties of coatings dedicated to high temperature performance, tribological applications and combined wear and corrosion resistance.

Moreover, using appropriate PVD equipment super-hard coatings can be deposited in a reproducible manner allowing great variety of material compositions. By selecting the appropriate layer composition, wear resistant coatings specialised for high temperature, low friction and corrosion resistant applications are possible.

However, such coatings whilst addressing the problems of wear resistance are still susceptible to micro welding and workpiece material pick-up due to the intensified chemical interaction between the coating and the workpiece material resulting from friction and hence heat generation at the tool-workpiece interface.

What is required therefore is a coating suitable for a substrate which addresses the above identified problems.

SUMMARY OF THE INVENTION

The inventors provide a PVD coating, and in particular a nanoscale multilayer superlattice PVD coating comprising high hardness, a low friction coefficient and increased chemical inertness.

According to a first aspect of the present invention there is provided a multilayer coating for a substrate, said multilayer coating comprising a repeating bilayer represented by $(V_x Me_{(1-x)})C_y N_{(1-y)}/(Me_z V_{(1-z)})C_y N_{(1-y)}$ where $0.1 \leq x \leq 0.9$; $0.01 \leq y \leq 0.99$ and $0.1 \leq z \leq 0.9$ and Me is a substantially pure metal or a metal alloy; wherein a composition of said coating through the layers alternates from layer to layer according to a V-rich layer and a Me-rich layer modulated sequence.

The present coatings are suitable for a variety of applications in particular coatings for substrates that are exposed to substantial frictional forces. The present coatings are particularly suited as coatings for cutting tools however further applications may include coatings for mechanical engine parts, for example automotive components, and other high-friction working components.

Preferably Me is a substantially pure metal comprising Al, Si, a rare earth element or a transition metal element selected from any one of groups 4, 5 or 6. Alternatively, Me is a metal alloy comprising any one or a combination of Al, Si, a rare earth element(s) and/or a transition metal element selected from group 4, 5 and/or 6. In particular, the metal alloy may comprise any one or a combination of the following AlCr, AlTi, AlW, AlMo, AlZr, AlHf, CrTi, CrW, CrMo, CrZr, CrHf, TiW, TiMo, TiZr, TiHf, WMo, WZr, WHf, MoZr, MoHf, ZrHf. Preferably, the metal alloy is a binary or ternary alloy.

Preferably, the V-rich layer comprises a composition $0.5 \leq x \leq 0.9$. In particular, x may be 0.8.

Preferably, the Me-rich layer comprises an composition $0.5 \leq z \leq 0.9$. In particular, z may be 0.6.

Preferably, any one or a combination of said plurality of layers comprises a composition where $0.005 \leq y \leq 0.05$.

Preferably, the cutting tool of the present invention comprises a coating thickness in the range 0.5 to 10 µm.

Preferably, the V-rich layer comprises a composition $(V_{0.8}Ti_{0.1}Al_{0.1})C_{0.012}N_{0.988}$ and the Me-rich layer comprises a composition $(Ti_{0.3}Al_{0.3}V_{0.4})C_{0.012}N_{0.988}$.

Preferably, the layer thickness of the repeating bilayer is less than or equal to 5 nm. In particular, the repeating bilayer thickness may be in the range 2 to 4 nm.

According to a second aspect of the present invention there is provided a cutting tool comprising a multilayer coating, said multilayer coating comprising a repeating bilayer represented by $(V_x Me_{(1-x)})C_y N_{(1-y)}/(Me_z V_{(1-z)})C_y N_{(1-y)}$ where $0.1 \leq x \leq 0.9$; $0.01 \leq y \leq 0.99$ and $0.1 \leq z \leq 0.9$ and Me is a substantially pure metal or a metal alloy; wherein a composition of said coating through the layers alternates from layer to layer according to a V-rich layer and a Me-rich layer modulated sequence.

Utilising Raman microscopy the inventors have gathered evidence to suggest that $V_2O_5$ in the as-formed wear debris, acts as a lubricating agent during sliding wear. The role of vanadium to reduce the friction coefficient by forming highly lubricious $V_2O_5$ during sliding, is disclosed in *J. Vac. Sci. Technol. A* 18(4), 1681-1689 the details of which relating to $V_2O_5$ are incorporated herein by reference.

In the case of nickel and aluminium based alloys the incorporation of vanadium, and associated reduction in the friction coefficient, is not sufficient to counterbalance the frictional resistance as sliding at the contact interface, (between cutting tool and workpiece material), occurs at the micron level, resulting in material pickup at the cutting edge, termed build-up edge formation. Accordingly, the inventors incorporate an additional component within the coating that has proven to prevent chemical reaction between the coated outer surface of the cutting tool and the workpiece material. This additional component, in the form of carbon serves to further stabilise the friction coefficient thereby increasing the chemical inertness (lower affinity) between cutting tool and workpiece material.

According to a third aspect of the present invention there is provided a method of manufacturing a cutting tool, the method comprising: coating a portion of said cutting tool by a PVD technique with a multilayer coating comprising a repeating bilayer represented by $(V_x Me_{(1-x)})C_y N_{(1-y)}/(Me_z V_{(1-z)})C_y N_{(1-y)}$ where $0.1 \leq x \leq 0.9$; $0.01 \leq y \leq 0.99$ and $0.1 \leq z \leq 0.9$ and Me is a substantially pure metal or a metal alloy; wherein a composition of said coating through the layers alternates from layer to layer according to a V-rich layer and a Me-rich layer modulated sequence.

Preferably, the method comprises pretreating the cutting tool prior to the step of coating the cutting tool, said pretreating comprising metal and/or gas ion etching.

According to one specific implementation, ion etching comprises metal ion implantation at the portion of said cutting tool in an environment of filtered or unfiltered cathodic arc discharge. Alternatively, ion etching comprises metal ion implantation at the portion of said cutting tool in an environment of high power impulse magnetron sputtering discharge.

Important to the performance of coatings, especially in demanding metal cutting applications, is the adhesion to the substrate. Metal ion implantation prior to coating deposition on metal or metal alloy substrates has been shown to promote localised epitaxial growth and improve adhesion of even highly stressed super-hard nano scale compositionally modulated coating systems. The high power impulse magnetron sputtering (HIPIMS) discharge is a relatively newly developed PVD technique which allows high plasma density and ionised metal particles to be produced at low pressures and without macro particle generation.

Bombarding the substrate surface with metal and/or gas ions has proved to be particularly successful. Excellent bonding strengths between coating and substrate are achieved due to the promotion of local epitaxial growth of the coating on the steel or tungsten carbide substrate. When the metal and/or gas ions are produced by a conventional cathodic arc discharge, an undesirable effect of droplet generation occurs which causes enlarged growth defects during the coating process. HIPIMS utilises pulsed magnetron discharges with extremely high power densities—up to three orders of magnitude higher than conventional systems. According to the present invention, the HIPIMS discharge is distributed over practically the entire cathode area providing a smooth erosion profile on the target and avoiding melting or droplet generation during the pretreatment prior to coating thus ensuring enhanced coating-substrate adhesion and high coating microstructural integrity. This in turn provides a coating with extremely high wear and corrosion resistance. The HIPIMS technique utilised with the present invention is disclosed in *Surface and Coatings Technology* 163-164 (2003) 267-272.

Preferably, the HIPIMS discharge is operated in pulses with discharge current densities in the range 0.10-10 $Acm^{-2}$, target voltages in the range −200 V to −2000 V, a pulse duration in the range 5-1000 μs, and pulse repetition frequency in the range 1-1000 Hz. Preferably, the HIPIMS sputtering discharge comprises generating a magnetic field at the cathode surface in the range 100 to 1000 Gauss and a pressure in the range $5 \times 10^{-4}$ mbar to $1 \times 10^{-2}$ mbar.

Preferably, the cutting tool is biased to a voltage in the range −200 to −2000V and the voltage is applied in a continuous or pulsed manner where the pulsing frequency is in the range 100 to 500,000 Hz or in the mega-herz range (radio-frequency bias).

According to the present invention the HIPIMS discharge operation parameters may take any value as will be appreciated by those skilled in the art in order to bombard the substrate surface with accelerated metal ions (e.g. Cr+Nb+, V+ or Ti+) to clean the surface so as to provide metal ion implantation and promote epitaxial growth, resulting in high adhesion and high microstructural integrity of the coating.

Nanoscale multilayer superlattice structured PVD coatings have been reported to exhibit high hardness values. An example of a nanoscale multilayer (superlattice) PVD coating is disclosed in *Surface Engineering* 2001 Vol 17 no. 1 15-27. According to the present invention the substrate comprises a nanoscale multilayer structured coating which may be deposited by unbalanced magnetron sputtering. The nanoscale multilayer superlattice architecture comprises a compositional modulation wherein the layer structure through the coating varies from vanadium rich to metal/metal alloy rich layers. This compositional modulation is achieved by precision control of the sputtering rate, the energy of the deposited atoms and the substrate rotation speed within the plasma discharge environment.

The interfaces between the individual layers in the nanoscale multilayer (superlattice) coating act as barriers hindering the dislocation movement across the layers, in turn providing a super-hard material (HP>40 GPa). For example, the coating of the present invention may comprise up to or more than a thousand of such individual layers.

Preferably, prior to the step of metal ion bombardment at the substrate, the substrate is firstly cleaned using one or more chemical cleaning agents and/or degreasing agents.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which.

DETAILED DESCRIPTION

There will now be described by way of example a specific mode contemplated by the inventors. In the following description numerous specific details are set forth in order to provide a thorough understanding. It will be apparent however, to one skilled in the art, that the present invention may be practiced without limitation to these specific details. In other instances, well known methods and structures have not been described in detail so as not to unnecessarily obscure the description.

Within this specification, the term 'V-rich layer' refers to the composition of a layer in which there is proportionally more vanadium than any other metal or metal alloy within the layer. The term 'Me-rich layer' refers to a layer composition in which proportionally the layer comprises less vanadium relative to any other metal or metal alloy within the layer.

Figure 1:
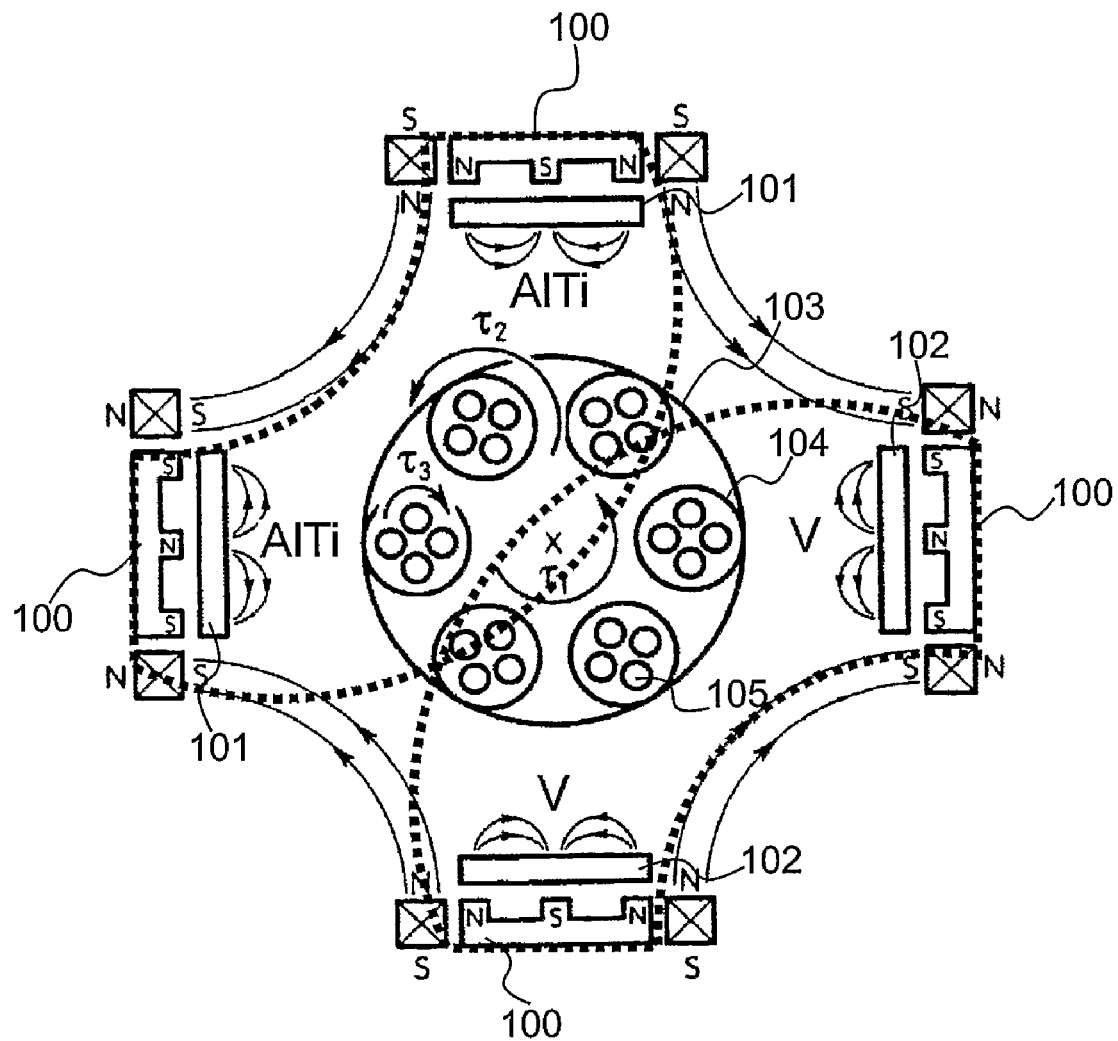
FIG. 1 herein is a schematic, cross-sectional plan view of the deposition apparatus utilised with the present invention.

FIG. 1 herein is a cross sectional plan view of a four cathode HTC-1000 PVD coating apparatus of the present invention. The system comprises four electromagnet arrangements positioned concentrically around four rectangular cathodes or targets 101, 102. The cathodes, according to the present invention allow steered cathodic arc evaporation, magnetron sputtering or unbalanced magnetron sputtering and in particular high power impulse magnetron sputtering (HIPIMS).

A three-fold rotatable planetary substrate holder 103 is positioned centrally between the four rectangular cathodes within the approximate 1 $m^3$ system chamber volume. The substrate holder comprises a first rotational axis $\tau_1$ (primary rotation), a secondary axis of rotation $\tau_2$ and a third axis of rotation $\tau_3$.

The distance between opposing cathodes is approximately 1 m. Substrates are mounted at the three-fold rotating planetary turn-table 103, 104, 105 to provide homogeneous coating in the growth direction. The vertically mounted rectangular (planar) cathodes of approximately 600 mm in length, are used to generate uniform coatings over a large portion of the height of the coating chamber. To minimize the target poisoning effect high pumping speeds provided by powerful turbo pumps (not shown) are used.

Example 1

Nanoscale Superlattice Multilayer Coating

A deposition procedure for the production of a nanoscale, compositionally modulated, multilayer structured coating of (VMe)(CN)/(MeV)(CN), where Me is AlTi is described.

The (VAlTi)(CN)/(AlTiV)(CN) superlattice nanoscale multilayer coating is deposited by reactive sputtering of two pairs of AlTi 50:50 at. % and V 99.8% pure targets opposing each other in a common $Ar+N_2+CH_4$ atmosphere as illustrated in FIG. 1 herein.

The necessary carbon atoms can be supplied by other carbon containing reactive gasses such as $C_2H_2$ or by evaporation or sputtering of a solid graphite target.

The metal atoms in the film can be produced not only by various types of sputtering techniques but also by evaporation methods such as arc evaporation.

The nanoscale multilayer coating deposition process utilized in this example comprised three major steps: surface pretreatment (etching), base layer deposition and nanoscale multilayer deposition.

The surface pre-treatment (etching), employed in the first stage of the process, guarantees strong adhesion of the coating. Methods such as gas or metal or gas-metal ion etching can be employed provided that sufficiently clean surface and high adhesion of the coating is achieved. Among them HIPIMS ion etching has shown to be most advantageous and is preferred.

The multi-target arrangement allows flexibility in the selection of the etching metal. According to the present specific implementation comprising a (VAlTi)(CN)/(AlTiV) (CN) nanoscale multilayer coating, V metal ion etching is employed.

According to further specific implementations, the etching metal may comprise a pure metal such as Al, Si, a rare earth element or an element selected from group 4, 5 or 6. The etching metal may also comprise a metal alloy, in particular a binary or ternary alloy including Al, Si, a rare earth element(s) and/or any one or a combination of elements selected from groups 4, 5 and 6 with unlimited range of concentrations, depending on the coatings formulation.

During surface pretreatment a HIPIMS discharge is operated at a target current density in the range 0.5-3 $Acm^{-2}$ in an environment of a low pressure Argon gas $<1\times10^{-3}$. The target comprises a single element or alloy material according to the choice of etching metal. The power density reaches typical peak levels of 1 $kWcm^{-2}$ and is applied at a duty cycle of approximately 1% in order to maintain the average power density to levels typical of conventional dc sputtering. In these conditions the ion current density to the substrates is of the order of 300 $mAcm^{-2}$. A substantial portion of the ion flux is ionized with metal ion fractions reaching typically 30% for Cr. A significant fraction of metal ions are doubly-ionised.

The substrates are immersed in the HIPIMS discharge and are biased to a high voltage in the range −200 V to −1200 V in order to enable high-energy metal ion bombardment of the surface.

Along with sputter-etching surface contaminations, the ion bombardment has the effect of incorporation of the etching metal into the substrate to depths of <30 nm as shown in analyses of the chemical composition of the interface. Such incorporation is known to lead to better adhesion of the coating to the substrate via a mechanism of epitaxial coating growth localized on individual grains of the substrate.

Figure 2:
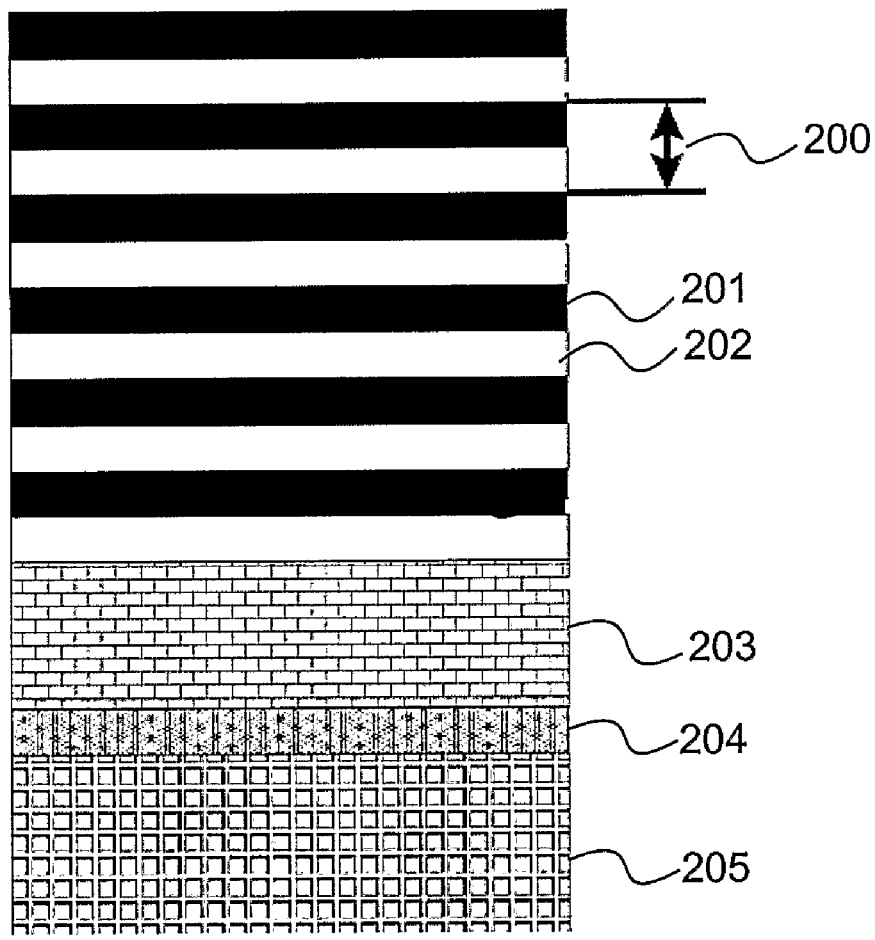
FIG. 2 herein is a schematic, cross-sectional side elevation view through a nanoscale multilayer (superlattice) hard PVD coating according to one aspect of the present invention.

FIG. 2 herein illustrates schematically the architecture of the (VAlTi)(CN)/(AlTiV)(CN) superlattice multilayer coating. The coating comprises a compositionally modulated structure comprising V-rich layers 201 and Me-rich layers 202.

Figure 3:
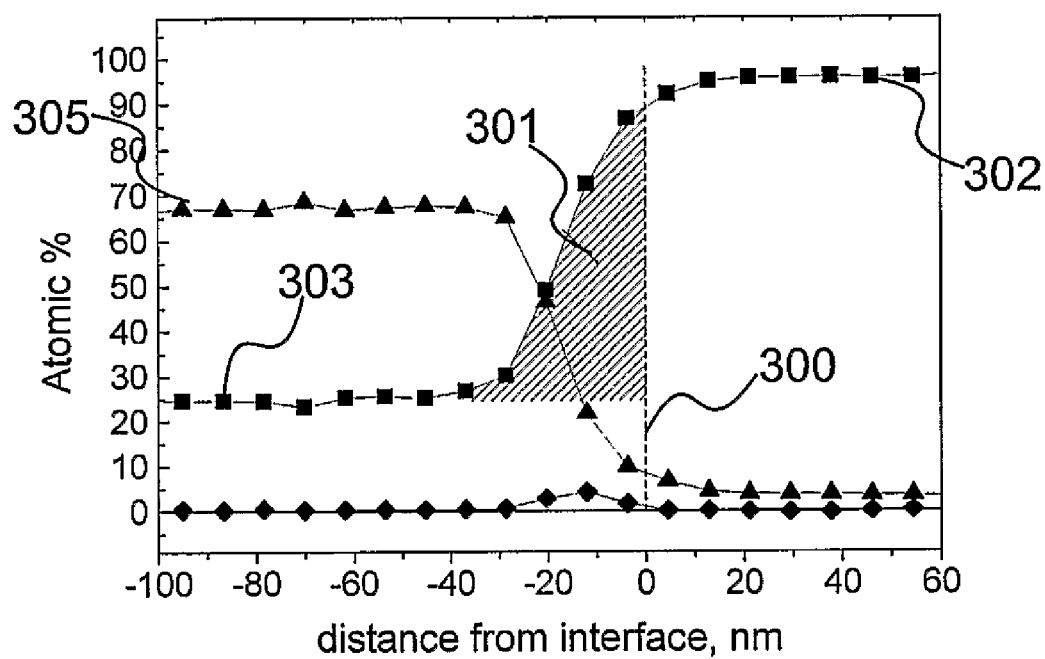
FIG. 3 herein illustrates the chemical composition of the interface between a transition metal nitride coating and a steel substrate, the etching metal ion is incorporated in the substrate by HIPIMS plasma etching.

After the surface pretreatment stage a 0.2-0.5 µm thick transition layer or base layer 203 is deposited by sputtering or evaporation techniques. FIG. 3 herein illustrates the chemical composition in the region of the substrate interface, indicated by the dashed line 300 (substrate 205 referring to FIG. 2 herein). Region 301 on the substrate side of the interface, comprises metal ion implanted zone 301 corresponding to base layer 203 and ion implanted zone 204. As can be seen from FIG. 3 herein the concentration of metal selected for the HIPIMS etching process (expressed in atomic %) increases from the substrate (205) region 303 through the ion implanted zone (204) and base layer (203) to plateau region 302.

In the present example a metal-nitride, AlTiN base layer is deposited by reactive magnetron sputtering of two AlTi targets, 50:50 at. % in a common Ar+$N_2$ atmosphere. A bias voltage of Ub=−75V is applied for improved crystallographic structure and higher coating density. The base layer provides a smooth transition in hardness and stress from the substrate material 205 to the coating and therefore further enhances the coating adhesion.

The multilayer coating is formed on top of the base layer 203 which, in turn, is formed on top of an ion implanted zone 204 resulting from ion bombardment during the HIPIMS discharge pretreatment process. The ion implanted zone is formed directly on the substrate 205 which is first cleaned, prior to ion bombardment with suitable chemical cleaning and/or degreasing agents.

In the third stage the nanoscale multilayer (VAlTi)(CN)/(AlTiV)(CN) coating is deposited by reactive sputtering of two pairs of AlTi 50:50 at. % and V 99.8% pure targets opposing each other in a common Ar+$N_2$+$CH_4$ atmosphere at total pressure 3.5 $10^{-3}$ mbar. In this stage all sputtering sources are operated at a preselected power, (8 kW) and a nanoscale multilayer coating is deposited due to the sequential exposure of the substrate surface to the material fluxes produced by the magnetrons.

In this example the V-rich layer is deposited during sample rotation past the half of the vacuum chamber where the V targets are mounted and the AlTi-rich layer is deposited when the samples pass the other half of the chamber where the AlTi targets are positioned.

As no mechanical, electrical or electromagnetic means or devices are used for deposition flux shielding in the vacuum chamber of the above described system a co-deposition from the opposite working cathodes occurs, which defines the average composition of the individual layers and the interface sharpness. In systems where special measures and devices such as shutters are in place, very sharp interfaces can be achieved. In such systems, employing targets with a preselected chemical composition and using relevant target arrangement in the vacuum chamber can lead to very precise control of the coating composition.

According to the specific implementation of the present invention the bilayer thickness 200 is defined by the rotation speed of the primary rotation, the power dissipated on the targets, the reactive gas pressure and the applied bias voltage. In this example a rotation speed of 3 rpm was used. The bias voltage of Ub=−75V was applied on the substrate during coating deposition, however the bias voltage can be varied in a wide range from −50 to −500 V if required.

The deposition temperature is in the range of T=400-450° C., however lower temperatures can also be used depending on the substrate material and application.

Following the above described system set up and technological steps a nano scale multilayer coating comprising a layer composition corresponding to $(V_{0.8}Al_{0.1}Ti_{0.1})(C_{0.012}N_{0.988})/(Al_{0.4}Ti_{0.4}V_{0.2})(C_{0.012}N_{0.988})$ has been deposited on cemented carbide drills and test samples of various materials such as high speed steel and stainless steel.

The coatings have been characterized using various techniques for surface analysis and testing. The following table summarises the main coating parameters.

TABLE 1

| Coating parameters | |
| --- | --- |
| Coating phase composition and crystallographic structure, XRD | Single phase, fcc structure |

TABLE 1-continued

Coating parameters

| | |
|---|---|
| Coating architecture, Low-angle XRD, XTEM | Nanoscale multilayer, bi-layer thickness, 200 = 2.2 nm |
| Crystallographic orientation, XRD | {200} preferred orientation |
| Residual stress state and magnitude, Glancing angle XRD | Compressive, 2.2 GPa |
| Average composition of the V-rich layer, at %, EFTEM and Z-contrast imaging for nanoscale multilayers | V = 40%, Al = 7%, Ti = 3%, C = 1.6%, N = 48.4% |
| Average composition of the Me-rich layer, at %, EFTEM and Z-contrast imaging for nanoscale multilayers | Al = 23%, Ti = 17%, V = 10%, C = 1.6%, N = 48.4% |
| Average composition of the coating, at %, SNMS | V = 25%, Al = 15%, Ti = 10%, C = 1.6%, N = 48.4% |
| Coating total thickness | 2.8 µm |
| Scratch test adhesion critical load, Lc | 55 N |
| Knoop Hardness, $HK_{0.025\ kg}$ | 2800 |
| Surface roughness, Ra | 0.025 µm |
| Coefficient of friction against $Al_2O_3$ counterpart, pin-on-disc test | 0.5 |
| Coefficient of friction against 100Cr6 counterpart, pin-on-disc test | 0.35 |
| Temperature for the onset of oxidation/rapid oxidation in air | 550/750° C. |

*XRD—X-ray diffraction; XTEM—cross-sectional transmission electron microscopy; EFTEM—energy-filtered transmission electron microscopy, SNMS—secondary neutral mass spectroscopy, Test Results of Nanoscale Superlattice Multilayer Coating In addition to the super hardness, the coatings of the present invention exhibit enhanced wear, corrosion and oxidation resistance due to crack deflection at the multilayer interfaces in addition to the formation of longer diffusion paths from the outermost region of the coating through to the substrate.

Figure 4A:
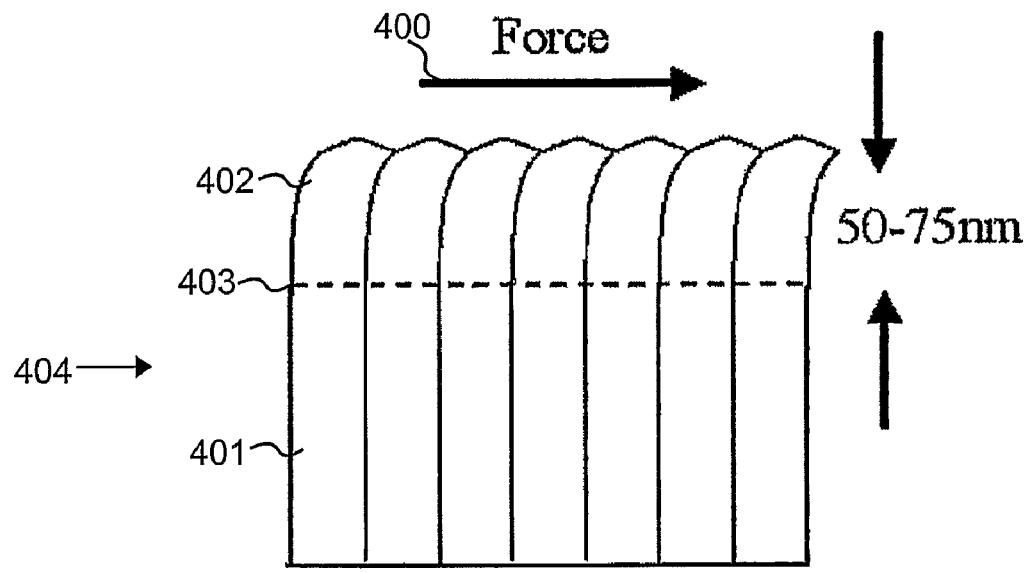
FIG. 4a herein illustrates schematically mechanical failure in monolithically grown coatings as found in the art.
Figure 4B:
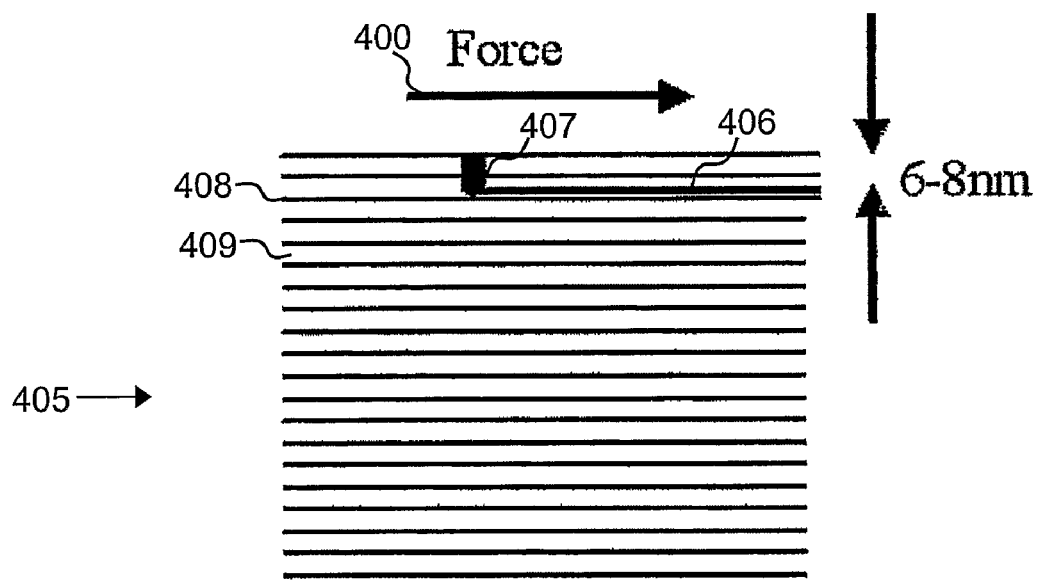
FIG. 4b herein illustrates schematically mechanical failure in the nanoscale multilayer superlattice coating according to one aspect of the present invention.

FIG. 4a herein illustrates TEM investigations on the wear mechanism of monolithically grown multicompliment coatings found in the art. FIG. 4b in contrast, illustrates the results of similar TEM wear mechanism investigations of nanoscale superlattice multilayer coatings according to the present invention.

The mechanical failure appears quite different when the two types of coating are exposed to severe shear forces 400 as occur in the case of abrasive wear. Referring to FIG. 4a herein, the individual grains 401 of columnar and monolithically grown coatings 404 experience severe plastic deformation 402, which is the source of mechanical breakage. The observed depth 403 of these failures reaches typically 50 to 75 nm. Referring to FIG. 4b herein, in contrast to these structurally related defects, a chipping or micro delamination mechanism was observed in the case of the superlattice structured coating 405 with a typical chipping depth 407 of 6 to 8 nm only. Wear, in nanoscale multilayers, may be regarded as a fine layer by layer wear mechanism where delamination 406 takes place at the interface 408 of the individual layers 409. Interfaces 408 act as deflecting barriers for both dislocation motion and crack prorogation.

The result of this failure deflection process associated with the present superlattice multilayer structures is the significant increase in the abrasion wear resistance of the coatings due to a reduction in the penetration of cracks.

The thickness of the individual layers and/or the number of the interfaces in the nanoscale multilayer structure strongly influences the wear behaviour of the coatings. Accordingly, for a coating of 3 µm having a bilayer thickness of 3 nm the coating will comprise 1000 individual layers (409) or 2000 interfaces (408) actively acting as barriers for both dislocation motion and crack prorogation. If the bilayer thickness is greater than for example 5 nm, both the barrier properties of the interfaces against dislocation motion as well as their number is reduced in turn reducing the high abrasion wear resistance of the coating. In particular, the hardness of the superlattice coating is dramatically reduced when the bilayer thickness of layers 409 is increased above 5 nm.

Figure 5:
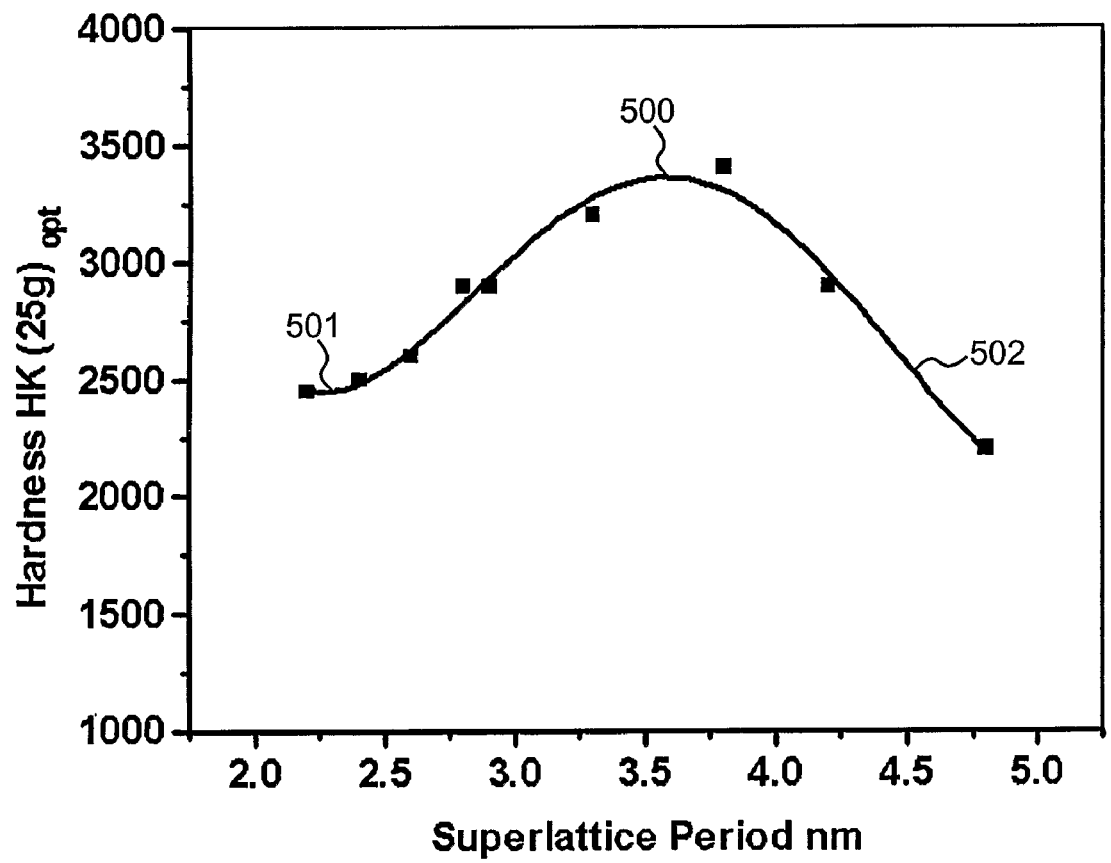
FIG. 5 herein is a graph illustrating the influence of the superlattice period on the hardness of a nanoscale multilayer coating according to one aspect of the present invention.

FIG. 5 herein illustrates coating hardness with variation of the bilayer thickness, referred to as the superlattice period, for a nanoscale multilayer coating of the present invention. A very sharp maximum 500 in the resultant hardness as a function of the lattice period is observed. On decreasing the bilayer thickness below 3.5 nm, the hardness also decreases and eventually plateaus 501 at an approximate bilayer thickness of 2.3 nm. A similar decrease in coating hardness is observed when increasing the superlattice period 501 above 3.5 nm. From FIG. 5 therefore, an optimum range for the bilayer thickness of the superlattice coating is 3 to 4 nm.

Drilling of Aerospace Composite Sheet Material

Single or combination drills, coated with the PVD coating of the present invention have been successfully used to machine various grades and combinations of composite sheet material.

Trials were carried out with a combination drill & reamer tool in an Aerospace application. The tools were manufactured from 10% Cobalt, sub micro grain tungsten carbide material. The tools comprised a recently developed geometry including a 4-facet drill point and a split and thinned web. The drilling process on the 5/16" diameter tool was carried out using air powered spindles running at circa 1,700 RPM. No coolant was used in the machining process, but air blast and MQL (minimum quantity lubrication) was employed and in some cases showed performance benefits. The composite sheeting was 8 mm thick comprising a synthetic top and bottom layer having several aluminium and synthetic middle layers.

Uncoated drills in these conditions produced two holes compared to 130 holes produced by the drills coated with a nanoscale superlattice multilayer coating according to the present invention.

The invention claimed is:

1. A multilayer coating for a metal article said multilayer coating comprising a repeating bilayer represented by $(V_x Me_{(1-x)} C_y N_{(1-y)} / (Me_z V_{(1-z)}) C_y N_{(1-y)}$ where $0.5 \leq x \leq 0.9$; $0.01 \leq y \leq 0.99$ and $0.5 \leq z \leq 0.9$ and Me is a substantially pure metal or a metal alloy;

wherein a composition of said coating through the layers alternates from layer to layer according to a V-rich layer and a Me-rich layer modulated sequence.

2. The coating as claimed in claim 1 wherein Me is a substantially pure metal comprising Al, Si, a rare earth element or an element selected from group 4, 5 or 6.

3. The coating as claimed in claim 1 wherein Me is a metal alloy comprising any one or a combination of Al, Si, a rare earth element and/or an element selected from group 4, 5 and/or 6.

4. The coating as claimed in claim 3 wherein Me comprises a binary or ternary alloy.

5. The coating as claimed in claim 1 wherein said V-rich layer comprises a composition where x is 0.8.

6. The coating as claimed in claim 1 wherein said Me-rich layer comprises a composition where z is 0.6.

7. The coating as claimed in claim 1 wherein any one or a combination of said plurality of layers comprises a composition where $0.005 \leq y \leq 0.05$.

8. The coating as claimed in claim 1 wherein said V-rich layer comprises a composition $(V_{0.8} Ti_{0.1} Al_{0.1}) C_{0.012} N_{0.988}$.

9. The coating as claimed in claim 1 wherein said Me-rich layer comprises a composition $(Ti_{0.3} Al_{0.3} V_{0.4}) C_{0.012} N_{0.988}$.

10. The coating as claimed in claim 1 wherein a layer thickness of said repeating bilayer is less than or equal to 5 nm.

11. The coating as claimed in claim 1 wherein a layer thickness of said repeating bilayer is in the range 2 to 4 nm.

12. The coating as claimed in claim 1 wherein said coating comprises a thickness in the range 0.5 to 10 μm.

13. The coating as claimed in claim 1 wherein said metal article comprises anyone of the following:
  a cutting tool;
  a component for an engine;
  a mechanical component for a vehicle; or
  a component used within a vehicle engine.

14. A cutting tool comprising a multilayer coating, said multilayer coating comprising a repeating bilayer represented by $(V_x Me_{(1-x)} C_y N_{(1-y)}/(Me_z V_{(1-z)} C_y N_{(1-y)}$ where $0.5 \leq x \leq 0.9$; $0.01 \leq y \leq 0.99$ and $0.5 \leq z \leq 0.9$ and Me is a substantially pure metal or a metal alloy;
  wherein a composition of said coating through the layers alternates from layer to layer according to a V-rich layer and a Me-rich layer modulated sequence.

15. The cutting tool as claimed in claim 14 wherein Me is a substantially pure metal comprising Al, Si, a rare earth element or an element selected from group 4, 5 or 6.

16. The cutting tool as claimed in claim 14 wherein Me is a metal alloy comprising any one or a combination of Al, Si, a rare earth element and/or an element selected from group 4, 5 and/or 6.

17. The cutting tool as claimed in claim 16 wherein Me comprises a binary or ternary alloy.

18. The cutting tool as claimed in claim 14 wherein said V-rich layer comprises a composition where x is 0.8.

19. The cutting tool as claimed in claim 14 wherein said Me-rich layer comprises a composition where z is 0.6.

20. The cutting tool as claimed in claim 14 wherein any one or a combination of said plurality of layers comprises a composition where $0.005 \leq y \leq 0.05$.

21. The cutting tool as claimed in claim 14 wherein said V-rich layer comprises a composition $(V_{0.8} Ti_{0.1} Al_{0.1}) C_{0.012} N_{0.988}$.

22. The cutting tool as claimed in claim 14 wherein said Me-rich layer comprises a composition $(Ti_{0.3} Al_{0.3} V_{0.4}) C_{0.012} N_{0.988}$.

23. The cutting tool as claimed in claim 14 wherein a layer thickness of said repeating bilayer is less than or equal to 5 nm.

24. The cutting tool as claimed in claim 14 wherein a layer thickness of said repeating bilayer is in the range 2 to 4 nm.

25. The cutting tool as claimed in claim 14 wherein said coating comprises a thickness in the range 0.5 to 1.0 μm.

26. A method of manufacturing a cutting tool, the method comprising: coating a portion of said cutting tool by a PVD technique with a multilayer coating comprising a repeating bilayer represented by $(V_x Me_{(1-x)} C_y N_{(1-y)}/(Me_z V_{(1-z)}) C_y N_{(1-y)}$ where $0.5 \leq x \leq 0.9$; $0.01 \leq y \leq 0.99$ and $0.5 \leq z \leq 0.9$ and Me is a substantially pure metal or a metal alloy;
  wherein a composition of said coating through the layers alternates from layer to layer according to a V-rich layer and a Me-rich layer modulated sequence.

27. The method as claimed in claim 26 further comprising:
  pretreating said cutting tool prior to said step of coating said cutting tool, said pretreating comprising metal and/or gas ion etching.

28. The method as claimed in claim 27 wherein said ion etching comprises metal ion implantation at said portion of said cutting tool in an environment of filtered or unfiltered cathodic arc discharge.

29. The method as claimed in claim 27 wherein said ion etching comprises metal ion implantation at said portion of said cutting tool in an environment of high power impulse magnetron sputtering discharge.

30. The method as claimed in claim 29 wherein said high power impulse magnetron sputtering discharge comprises a current density in the range 0.10-10 Acm$^{-2}$.

31. The method as claimed in claim 29 wherein said high power impulse magnetron sputtering discharge comprises a target voltage in the range −200 V to −2000V.

32. The method as claimed in claim 29 wherein said high power impulse magnetron sputtering discharge comprises a pulse duration in the range 5-1000 μs.

33. The method as claimed in claim 29 wherein said high power impulse magnetron sputtering discharge comprises a pulse repetition frequency in the range 1-1000 Hz.

34. The method as claimed in claim 29 wherein said high power impulse magnetron sputtering discharge comprises generating a magnetic field at the surface of a target in the range 100 to 1000 Gauss and a pressure in the range $5 \times 10^{-4}$ mbar to $1 \times 10^{-2}$ mbar.

35. The method as claimed in claim 34 wherein said portion of said cutting tool is biased to a voltage in the range −200 to −2000 V; and said voltage is applied in a continuous or pulsed manner where a pulsing frequency is within the range 100 to 500,000 Hz.

36. The method as claimed in claim 27 wherein said metal ion etching comprises metal ions selected from anyone or a combination of Al, Si and/or an element selected from group 4, 5 and/or 6.

37. The method as claimed in claim 26 wherein said V-rich layer comprises a composition where x is 0.8.

38. The method as claimed in claim 26 wherein said Me-rich layer 5 comprises a composition where z is 0.6.

39. The method as claimed in claim 26 wherein any one or a combination of said plurality of layers comprises a composition where $0.005 \leq y \leq 0.05$.

40. The method as claimed in claim 26 further comprising:
  coating said portion of said cutting tool to achieve a multilayer coating 5 thickness of 0.5 to 10 μm.

41. The method as claimed in claim 26 wherein a layer thickness of said repeating bilayer is less than or equal to 5 nm.

42. The method as claimed in claim 26 wherein a layer thickness of said repeating bilayer is in the range 2 to 4 nm.

* * * * *